United States Patent
Nam et al.

(10) Patent No.: US 6,518,157 B2
(45) Date of Patent: Feb. 11, 2003

(54) METHODS OF PLANARIZING INSULATING LAYERS ON REGIONS HAVING DIFFERENT ETCHING RATES

(75) Inventors: Gee-won Nam, Kyoungsangbuk-do (KR); Gi-jong Park, Kyungki-do (KR); Hong-kyu Hwang, Kyungki-do (KR); Jun-shik Bae, Seoul (KR); Young-rae Park, Kyungki-do (KR); Jung-yup Kim, Seoul (KR); Bo-un Yoon, Seoul (KR); Sang-rok Hah, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/917,601

(22) Filed: Jul. 27, 2001

(65) Prior Publication Data

US 2002/0045337 A1 Apr. 18, 2002

(30) Foreign Application Priority Data

Jul. 28, 2000 (KR) .............................. 00-43680

(51) Int. Cl.⁷ ............................................. H01L 21/44
(52) U.S. Cl. ...................... 438/597; 438/626; 438/631; 438/633; 438/645
(58) Field of Search ................................ 438/626, 631, 438/645, 633, 597

(56) References Cited

U.S. PATENT DOCUMENTS

| | | | | |
|---|---|---|---|---|
| 4,662,064 A | * | 5/1987 | Hsu et al. ................. 438/631 |
| 4,954,459 A | * | 9/1990 | Avanzino et al. ..... 148/DIG. 51 |
| 5,015,602 A | * | 5/1991 | Van Der Plas et al. ...... 438/424 |
| 5,139,608 A | * | 8/1992 | Grivna .................... 438/697 |
| 5,405,800 A | * | 4/1995 | Ogawa et al. ............. 438/253 |
| 5,500,558 A | * | 3/1996 | Hayashide ................ 257/758 |
| 5,580,826 A | * | 12/1996 | Matsubara et al. ......... 430/313 |
| 5,639,697 A | * | 6/1997 | Weling et al. ............. 438/633 |
| 5,663,107 A | * | 9/1997 | Peschke et al. ........... 438/437 |
| 5,721,172 A | * | 2/1998 | Jang et al. ................. 216/38 |
| 5,792,707 A | * | 8/1998 | Chung .................... 438/633 |
| 5,840,619 A | * | 11/1998 | Hayashide ................ 438/598 |
| 5,885,900 A | * | 3/1999 | Schwartz ................. 438/697 |
| 5,965,939 A | * | 10/1999 | Kim et al. ................. 257/296 |
| 5,965,941 A | | 10/1999 | Weling et al. ............. 257/758 |
| 6,025,270 A | * | 2/2000 | Yoo ........................ 216/57 |
| 6,274,509 B1 | * | 8/2001 | Hsieh et al. .............. 438/631 |
| 6,280,644 B1 | * | 8/2001 | Martin et al. .............. 216/16 |
| 6,333,221 B1 | * | 12/2001 | Lee ......................... 438/239 |

FOREIGN PATENT DOCUMENTS

KR          97-072311          11/2002

OTHER PUBLICATIONS

Notice to Submit Response, Korean Application No. 10–2000–0043680, Feb. 22, 2002.

\* cited by examiner

Primary Examiner—John F. Niebling
Assistant Examiner—Angel Roman
(74) Attorney, Agent, or Firm—Myers Bigel Sibley & Sajvoec

(57) ABSTRACT

An insulating layer can be formed on first and second adjacent regions of an integrated circuit having a first step difference therebetween, the first and second regions having first and second respective etch rates associated therewith. A recess can be formed in the insulating layer on the second region having a second step difference with the first region that is less than the first step difference to provide a portion of the insulating layer between the first and second adjacent regions having a third step difference with the first region that is greater than the second step difference. A width of the portion is selected based on a difference between the first and second etch rates.

29 Claims, 5 Drawing Sheets

METHODS OF PLANARIZING INSULATING LAYERS ON REGIONS HAVING DIFFERENT ETCHING RATES

CLAIM FOR FOREIGN PRIORITY

This application claims priority to Korean Application No. 2000-43680, filed Jul. 28, 2000, the disclosure of which is hereby incorporated herein by reference.

FIELD OF THE INVENTION

The present invention relates to methods of forming integrated circuits in general, and more particularly, to methods of planarizing interlevel insulating layers in integrated circuits.

BACKGROUND OF THE INVENTION

In general, an interlevel insulating layer can be formed on a cell block to insulate an upper electrode of a capacitor from an overlying wiring line. The interlevel insulating layer can have a step difference caused by the height of the capacitor. A surface of the interlevel insulating layer overlying the capacitor can be higher than that of the interlevel insulating layer overlying another portion of the integrated circuit, such as a peripheral circuit region, a core region, or a test element group (TEG) region.

Since a step difference on an interlevel insulating layer may cause a failure in a photolithography process, the interlevel insulating layer may need to be planarized. One approach to planarization of the interlevel insulating layer can involve introducing a reflow process after forming an interlevel insulating layer using borophosphosilicate glass (BPSG). However, as the height of a capacitor increases to provide a desired capacitance, it may become more difficult to suppress a high step difference on an interlevel insulating layer using the reflow process.

Another approach to planarization of an interlevel insulating layer can involve planarization by Chemical Mechanical Polishing (CMP). However, an edge portion of the interlevel insulating layer overlying a capacitor adjacent to a slanting portion of the interlevel insulating layer between the portions having the step difference therebetween may be over polished. This can be due to a large step difference between a first portion of the interlevel insulating layer overlying the capacitor and a second portion of the interlevel insulating layer overlying a peripheral circuit region or a core region and a slanting portion between the first and second portions is large. The over polishing may result in a failure such as the exposure of an upper electrode of a capacitor or loss of a portion of an upper electrode.

Furthermore, when performing the CMP, the interlevel insulating layer may be deposited to a thickness greater than what may be needed for an actual process. This can decrease a step difference of the interlevel insulating layer by increasing the deposited thickness of the interlevel insulating layer on a core region or a peripheral circuit region on which a capacitor is not formed. However, this approach can make the interlevel insulating layer overlying a core region or a peripheral circuit region thicker, which may lead to etching failure or opening failure caused by incomplete etching during a subsequent dry etching process.

SUMMARY OF THE INVENTION

Embodiments according to the present invention can provide methods for planarizing insulating layers on regions that have different rates of etching. Pursuant to these embodiments, an insulating layer can be formed on first and second adjacent regions of an integrated circuit having a first step difference therebetween, the first and second regions having first and second respective etch rates associated therewith. A recess can be formed in the insulating layer on the second region having a second step difference with the first region that is less than the first step difference to provide a portion of the insulating layer between the first and second adjacent regions having a third step difference with the first region that is greater than the second step difference. A width of the portion is selected based on a difference between the first and second etch rates.

In some embodiments according to the present, the portion of the insulating layer between the first and second adjacent regions is planarized at the first etch rate and the insulating layer on the second region is planarized at the second etch rate that is less than the first etch rate, to provide a fourth step difference between the first and second regions that is less than the first step difference. In some embodiments according to the present, the planarizations are performed substantially simultaneously.

In some embodiments according to the present, the width of the portion of the insulating layer between the first and second adjacent regions is about 20% to 50% of a width of the second region. In some embodiments according to the present, the width of the portion of the insulating layer between the first and second adjacent regions is in a range between about 20 $\mu$m and 80 $\mu$m.

In some embodiments according to the present, the first region is a scribe region, a peripheral region, or a test element group region on an integrated circuit wafer and the second region is a cell block region of an integrated circuit memory device on the integrated circuit wafer.

In some embodiments according to the present, the width of the portion of the insulating layer between the first and second adjacent regions is in a range between about 2 $\mu$m and 5 $\mu$m. In some embodiments according to the present, the first region is a core region located between adjacent cell block regions of an integrated circuit memory device on an integrated circuit wafer, and the second region is a cell block region of the integrated circuit memory device.

DETAILED DESCRIPTION OF EMBODIMENTS OF THE INVENTION

Figure 1:
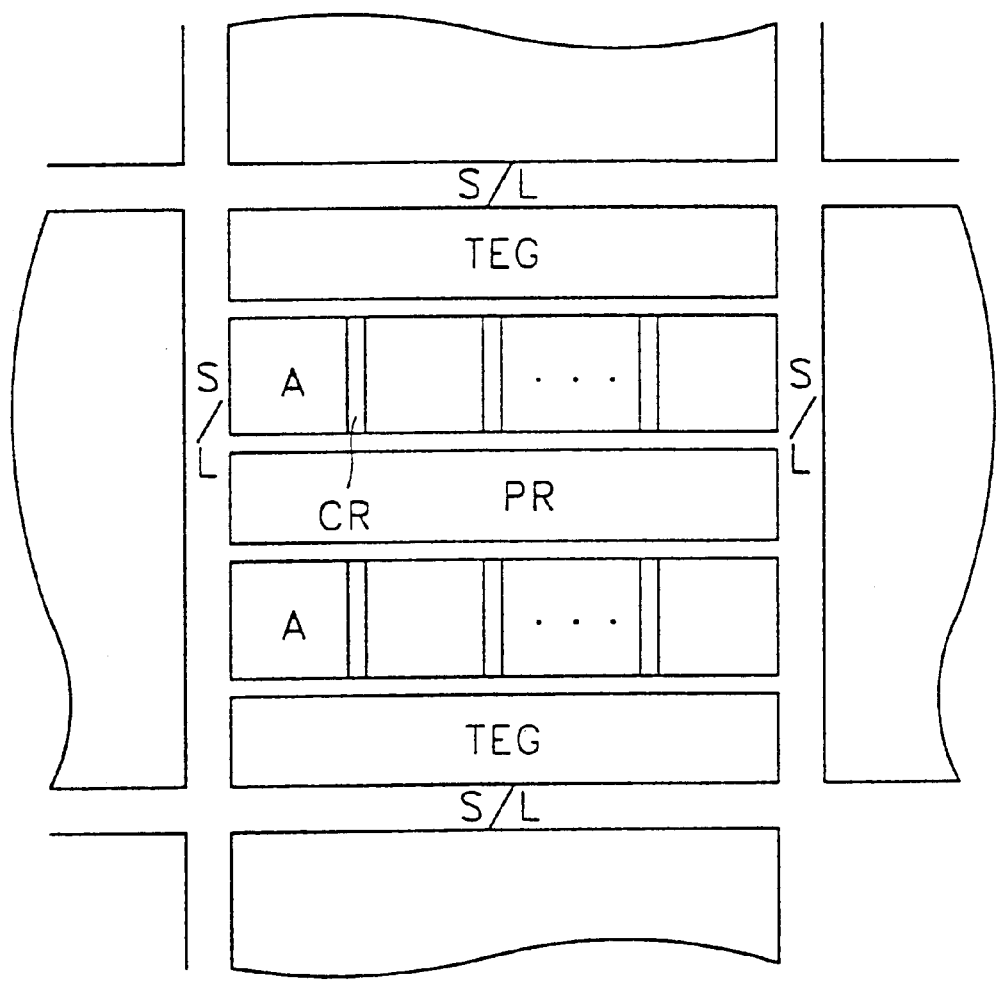
FIG. 1 is a schematic layout diagram of an integrated circuit that illustrates embodiments of methods according to the present invention.

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. It will be understood that when an element such as a layer, region or substrate is referred to as being "on" another element, it can be directly on the other element or intervening elements may also be present. Like numbers refer to like elements throughout.

Referring to FIG. 1, an integrated circuit device can include a chip area having a plurality of cell blocks A in which a plurality of unit cells (not shown) are formed on an integrated circuit substrate or wafer. Other regions that neighbor the cell blocks A, are separated from the cell blocks A by scribe line (S/L) regions. The plurality of cell blocks A are arranged transversely with a core region CR located between adjacent cell blocks. Test element group (TEG) regions are aligned longitudinally relative to the neighboring cell blocks A. A peripheral circuit region PR is arranged longitudinally between the transverse cell blocks A.

Figure 2:
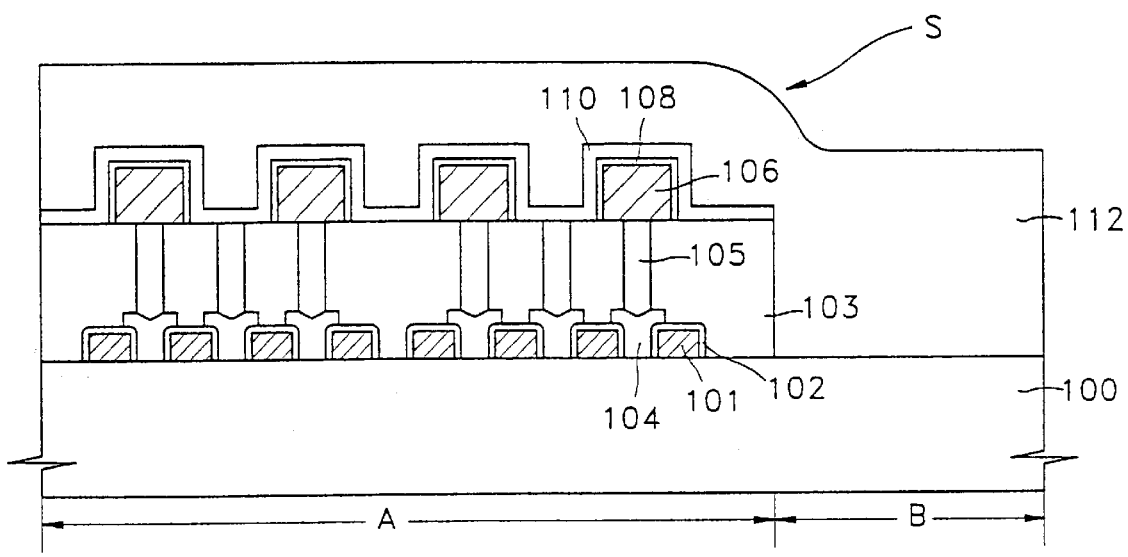
FIGS. 2, 3A, 3B, and 4 are cross sectional views that illustrate embodiments of methods of planarizing interlevel insulating layers in integrated circuits according to the present invention.

FIGS. 2, 3A, 3B, and 4 are cross sectional views that illustrate method embodiments of planarizing an interlevel insulating layer in an integrated circuit according to the invention. A and B denote a cell block and a region other than the cell block A, respectively. Referring to FIG. 2, unit cells include: a source/drain region (not shown), a gate pattern 101, and a capping insulating layer 102, on cell block A on an integrated circuit substrate 100.

A capacitor is formed on the cell block A of the integrated circuit substrate 100. The capacitor includes: a lower electrode 106 that is electrically connected to a conductive plug 105 that passes through a lower insulating layer 103 and is electrically connected to an active region of the integrated circuit substrate 100. A dielectric layer 108 is on the lower electrode 106 and an upper electrode 110 is on the dielectric layer 108. The upper electrode 110 may be formed of a conductive material such as conductive polysilicon, ruthenium, platinum, or tungsten silicide.

An interlevel insulating layer 112 is formed on the entire structure. The interlevel insulating layer 112 exhibits a surface step difference S due to a difference in height between the height of the interlevel insulating layer on the unit cell and the capacitor and the region B that is adjacent to (or neighbors) the cell block A. Preferably, the interlevel insulating layer 112 is formed of an insulating material having a high flow ability so as to reduce the step difference S due to the height of a capacitor. For example, the interlevel insulating layer 112 may be formed of a borophosphosilicate glass (BPSG) layer, a phosphosilicate glass (PSG) layer, a plasma enhanced tetraethylorthosilicate (PE-TEOS) layer, an undoped silicate glass (PSG) layer, or a flowable oxide (FOX) layer.

In particular, the step difference on the interlevel insulating layer 112 can be reduced by a high flow ability of the insulating material of the interlevel insulating layer 112. However, a step difference may remain between the cell block A on which the capacitor is formed and the other region B, on which the capacitor is not formed, such as a peripheral circuit region, a scribe line region, and a core region.

In other words, the interlevel insulating layer 112 on the cell block A overlying the capacitor may become a high step difference region, while the interlevel insulating layer 112 not overlying the capacitor becomes a low step difference region. The interlevel insulating layer 112 can be formed so that the surface of the low step difference region is thicker than, at least the upper electrode 110, considering a subsequent planarization process.

Figure 3A:
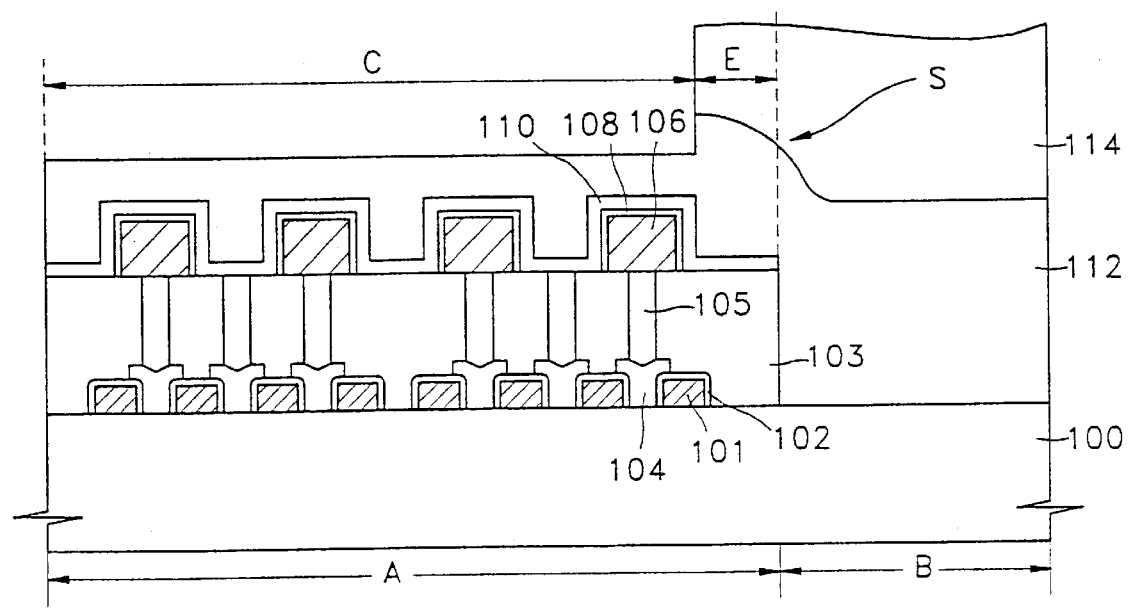
Figure 3B:
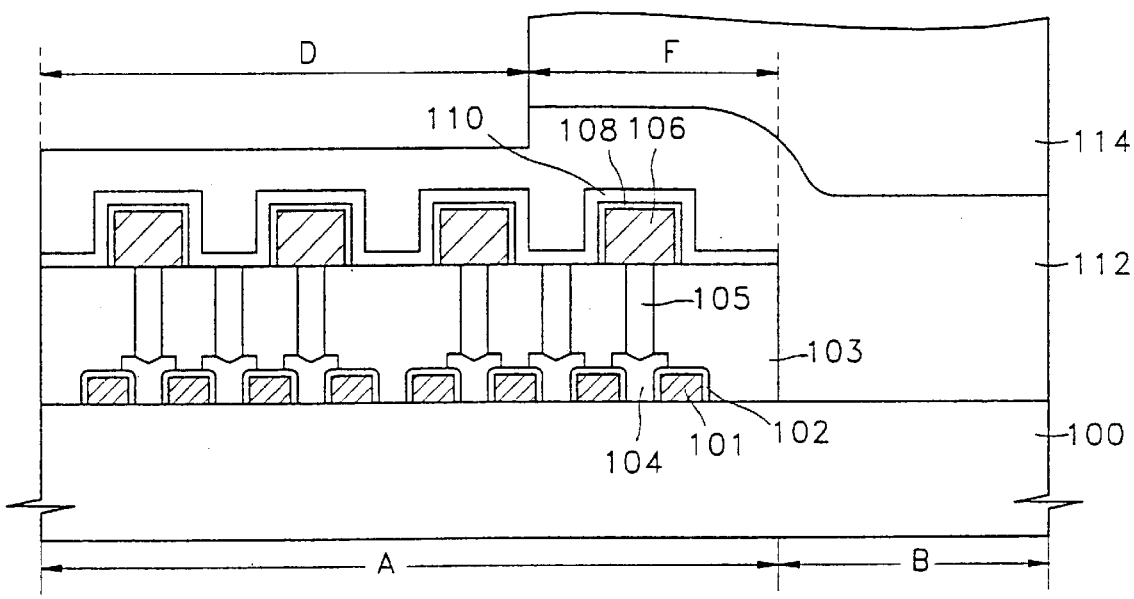

Referring to FIGS. 3A and 3B, a mask pattern 114, such as a photoresist pattern, is formed on a portion of the interlevel insulating layer 112 on the cell block A overlying the capacitor using a photo-etching process. The interlevel insulating layer 112 is etched using the mask pattern 114 as an etch mask to form cell open regions (denoted by C of FIGS. 3A and D of FIG. 3B). The cell open regions C and D are formed by a partial etch during which etching time can be controlled to remove a predetermined thickness of the interlevel insulating layer 112, using dry etching or wet etching. The reason for forming the cell open region C or D is that a difference between a high step difference region of the interlevel insulating layer 112 on the cell block A and a low step difference region on the neighboring region is reduced so as to facilitate a subsequent CMP process. The etching time of the cell open regions C and D can be controlled so that at least the upper electrode 110 is not exposed.

According to embodiments of the present invention, the area and shape of the cell open regions C and D can differ to adjust a separation distance from the cell open region to the edge of the cell block based on the nature of the region that is adjacent to the cell block on which the cell open region is formed. In some embodiments according to the present invention, if the edge of the cell block A is adjacent to a low step difference region that is narrow relative to other regions that are adjacent to the cell block A, such as the core region (CR of FIG. 1), a separation distance from the edge of the cell block A is made short as indicated by "E" in FIG. 3A to form the cell open region C. In some embodiments according to the present invention, if the edge of the cell block A is adjacent to a low step difference region that is wide relative to other regions adjacent to the cell block A, such as the peripheral circuit region (PR of FIG. 1) or TEG region of FIG. 1, a separation distance from the edge of the cell block A is made long as indicated by "F" in FIG. 3B to form the cell open region D. In other words, the cell open region D on the cell block A adjacent to the relatively wide low step difference region has a greater (or longer) separation distance from the edge of the cell block A when compared to the cell open region C on the cell block A that is adjacent to the relatively narrow low step difference region. The reason for varying the area or shape of the cell open regions C and D on different cell blocks or varying a separation distance from the edge of the cell block A within one cell block A is to improve polishing uniformity during CMP.

Figure 4:
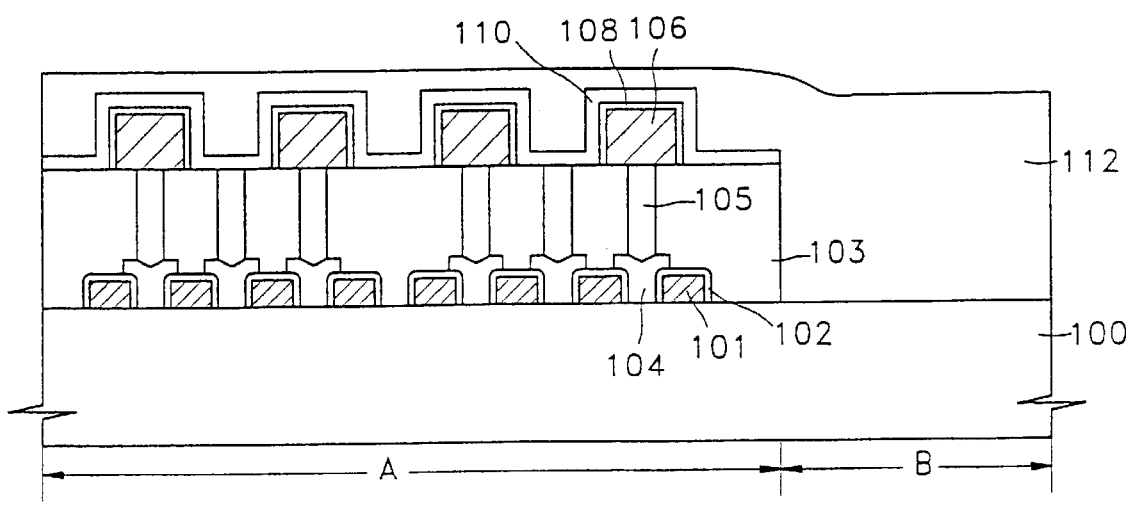

Referring to FIG. 4, the mask pattern 114 used as an etch mask for forming the cell open regions C and D is removed. A CMP process is performed on the interlevel insulating layer 112 on the high step difference region and the surrounding low step difference region in order to planarize it. During the CMP, the rate of polishing in the high step difference region on the interlevel insulating layer 112 of the cell block A is faster than in the low step difference region, such as a core region, a TEG region, or a peripheral circuit region. Furthermore, the edge of the cell block A on the high step difference region may be polished more than the region inside the cell block A.

Since the edge of the cell block A is positioned adjacent to a slanted portion of the interlevel insulating layer 112, it may be exposed and damaged by a conventional process.

However, since a polishing rate at the edge of the cell block A neighboring the relatively narrow low step difference region is low, the interlevel insulating layer 112 is left over a narrower region with a high thickness. On the other hand, since a polishing rate at the edge of the cell block A neighboring the relatively wide low step difference region is high, the interlevel insulating layer 112 is left over a wider region with a high thickness. Thus, etching uniformity of the interlevel insulating layer in the present invention can be improved, thereby preventing the edge portion of the upper electrode 110 from being exposed by the CMP while improving polishing uniformity within an integrated circuit wafer.

The reason for varying the area or shape of the cell open regions per cell block, or varying a separation distance from the edge of the cell block within one cell block as shown in FIGS. 3A and 3B will now be described in more detail.

Figure 5:
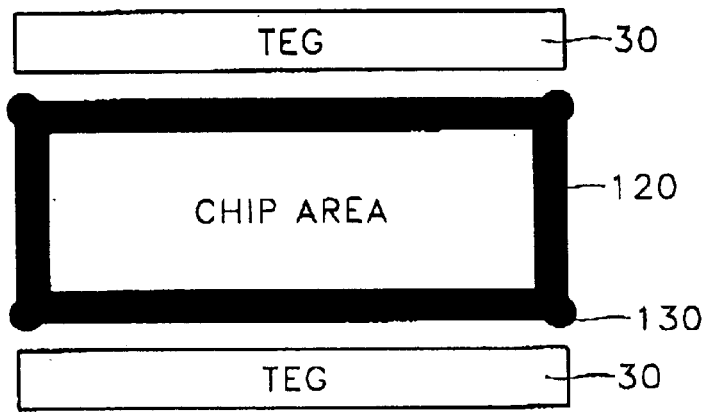
FIG. 5 is a plan view that illustrates differences in polishing rates for different regions according to the present invention.

FIG. 5 is a top view that illustrates different polishing rates for different regions when performing CMP on the interlevel insulating layer of an integrated circuit device in accordance with the invention. Specifically, polishing rates can vary depending on the density of the pattern being polished. That is, an unpatterned portion and a densely patterned portion may have different polishing rates. In particular, as an unpatterned region becomes wider, the polishing or etch rate of a region adjacent thereto may become higher. Thus, an edge 120 of the area (hereinafter referred to as "chip" area) in which the cell block A and the neighboring regions are formed in the integrated circuit device of FIG. 1 is a region having a relatively high polishing rate, and a corner region 130 of the chip area is a region having a still higher polishing rate. Thus, in embodiments according to the present invention, the polishing rate of the edge 120 of the chip area may be compensated for so that a difference between the rates of polishing at the edges 120 and 130 may be reduced to improve the planarization of the integrated circuit.

Figure 6:
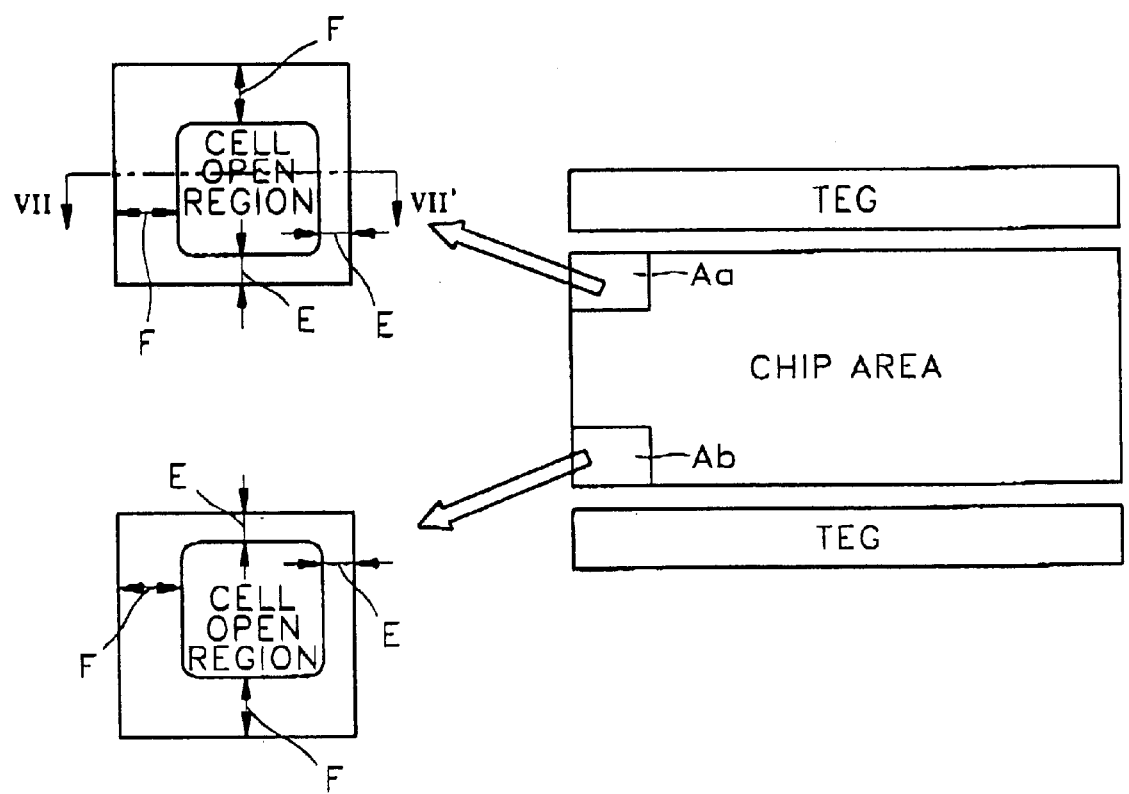
FIG. 6 illustrates embodiments of forming cell open regions shown in FIGS. 3A and 3B according to the present invention.
Figure 7:
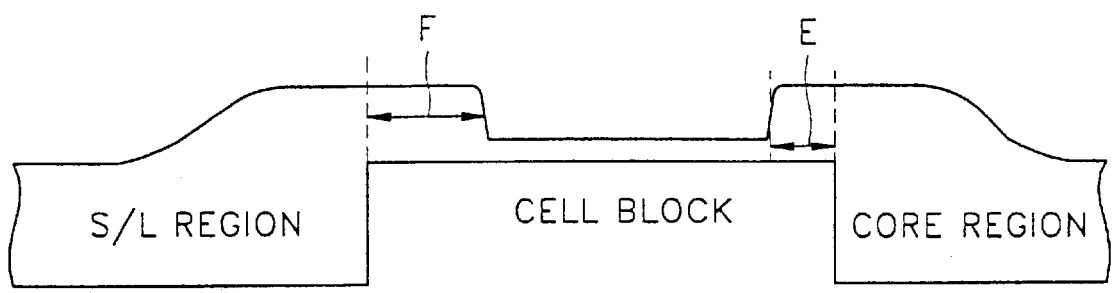
FIG. 7 is a cross sectional view that illustrates a cell block taken along line VII–VII' in FIG. 6 according to the present invention.

FIG. 6 illustrates forming the cell open regions shown in FIGS. 3A and 3B, and FIG. 7 is a cross sectional view that illustrates a first cell block taken along line VII–VII' of FIG. 6 according to the present invention. To improve polishing uniformity over the entire chip area, the area or shape of the cell open regions can vary for each cell block. That is, the cell open region of a first cell block Aa located at a upper left corner can be formed differently from the cell open region of a second cell block Ab located at a lower left corner.

Since the first cell block Aa is formed adjacent to a scribe line region and a TEG region, which are wide low step difference regions, at a upper left corner, the first cell block Aa is formed with a separation distance corresponding to "F", for example, 20% to 50% of the width of the cell block, preferably, 20–80 μm, from left and top edges of the cell block and a separation distance corresponding to "E", which is smaller than "F", for example, 2–5 μm, from right and bottom edges of the cell block, respectively. On the other hand, since the second cell block Ab is formed adjacent to a scribe line region and a TEG region, which are wide low step difference regions, at a lower left corner, the second cell block Ab is formed with a separation distance corresponding to "F", for example, 20% to 50% of the width of the cell block, preferably, 20–80 μm, from left and bottom edges of the cell block and a separation distance corresponding to "E", which is smaller than "F", for example, 2–5 μm, from top and right edges of the cell block, respectively.

Furthermore, as has been described in association with FIG. 5, a polishing rate on the edge of the chip area can be greater than that of the other neighboring region. Therefore, as shown in FIG. 7 the cell open area is formed having a separation distance from the edge of the cell block, which may vary within one cell block. For example, the cell open region of the first cell block Aa is formed so that a portion adjacent to a scribe line region and a TEG region, which are wide low step difference regions, at an upper left corner has a separation distance corresponding to "F", and a portion adjacent to a core region, which is a narrow low step difference region, has a separation distance corresponding to "E" which is smaller than "F". Since the edge of a cell block neighboring a narrow low step difference region has a low polishing rate, the interlevel insulating layer 112 is left over a relatively narrow region (E of FIG. 7). On the other hand, since the edge of a cell block neighboring a wide low step difference region has a high polishing rate, the interlevel insulating layer 112 is left over a relatively wide region (F of FIG. 7). Accordingly, embodiments according to the present invention can improve polishing uniformity during CMP.

As has been described in the foregoing, in the method of planarizing an interlevel insulating layer in an integrated circuit device according to the invention, a cell open region having a different shape or area can be formed on a per cell block basis. Furthermore, a separation distance from an edge of the cell block can vary within the cell block. As a result, the polishing rates for different areas of the entire chip can be made more uniform during CMP. Accordingly, embodiments according to the present invention may prevent exposure of an upper electrode of a capacitor, loss of a portion of the upper electrode, or failure in a subsequent photolithography process.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed:

1. A method of planarizing an interlevel insulating layer in an integrated circuit, the method comprising:

forming an insulating layer on first and second adjacent regions of an integrated circuit having a first step difference therebetween, the first and second regions having first and second respective etch rates associated therewith; and forming a recess in the insulating layer on the second region having a second step difference with the first region that is less than the first step difference to provide a portion of the insulating layer between the first and second adjacent regions having a third step difference with the first region that is greater than the second step difference, wherein a width of the portion is selected based on a difference between the first and second etch rates.

2. A method according to claim 1 further comprising:

planarizing the portion of the insulating layer between the first and second adjacent regions at the first etch rate; and planarizing the insulating layer on the second region at the second etch rate that is less than the first etch rate, to provide a fourth step difference between the first and second regions that is less than the first step difference.

3. A method according to claim 2 wherein the planarizing the portion of the insulating layer between the first and second adjacent regions at the first etch rate and the planarizing the insulating layer on the second region are performed substantially simultaneously.

4. A method according to claim 1 wherein the third step difference is about equal to the first step difference.

5. A method according to claim 1 wherein the width of the portion of the insulating layer between the first and second adjacent regions is about 20% to 50% of a width of the second region.

6. A method according to claim 5 wherein the width of the portion of the insulating layer between the first and second adjacent regions is in a range between about 20 $\mu$m and 80 $\mu$m.

7. A method according to claim 5 wherein the first region comprises a scribe region, a peripheral region, or a test element group region on an integrated circuit wafer and wherein the second region comprises a cell block region of an integrated circuit memory device on the integrated circuit wafer.

8. A method according to claim 1 wherein the width of the portion of the insulating layer between the first and second adjacent regions is in a range between about 2 $\mu$m and 5 $\mu$m.

9. A method according to claim 8 wherein the first region comprises a core region located between adjacent cell block regions of an integrated circuit memory device on an integrated circuit wafer, and wherein the second region comprises a cell block region of the integrated circuit memory device.

10. A method of planarizing an interlevel insulating layer in an integrated circuit device, the method comprising:

forming an interlevel insulating layer having a high step difference region on a cell block in the integrated circuit device and a low step difference region on a neighboring region over an integrated circuit substrate, in which a plurality of chip areas are formed, each chip area including the cell blocks on which a plurality of unit cells are formed;

forming a mask pattern having a cell open region for exposing the high step difference region, an area or shape of which varies on each cell block, on the interlevel insulating layer;

performing a partial etch on the high step difference region using the mask pattern as an etch mask to decrease a step difference between the high step difference region and the low step difference region;

removing the mask pattern used as the etch mask; and performing chemical mechanical polishing (CMP) on the interlevel insulating layer on the high step difference region subjected to the partial etch and the low step difference region to planarize the interlevel insulating layer.

11. A method according to claim 10, wherein a cell open region adjacent to a wide low step difference region has a long separation distance from an edge of the cell block, compared with a cell open region adjacent to a narrow low step difference region.

12. A method according to claim 11, wherein the wide low step difference region is a test element group (TEG) region, a peripheral circuit region, or a scribe line region, and the narrow low step difference region is a core region.

13. A method according to claim 11, wherein the cell block of the cell open region adjacent to the wide low step difference region has a separation distance from an edge of the cell block of 20% to 50% of the width of the cell block, and the cell open region adjacent to the narrow low step difference region has a separation distance from an edge of the cell block of 2–5 $\mu$m.

14. A method according to claim 13, wherein the cell open region adjacent to the wide low step difference region has a separation distance from the edge of the cell block of 20–80 $\mu$m.

15. A method according to claim 10, wherein the interlevel insulating layer is formed of a borophosphosilicate glass (BPSG) layer, a phosphosilicate glass (PSG) layer, a plasma enhanced tetraethylorthosilicate (PE-TEOS) layer, an undoped silicate glass (PSG) layer, or a flowable oxide (FOX) layer.

16. A method according to claim 10, wherein the partial etch of the interlevel insulating layer is performed using dry etching or wet etching.

17. A method of planarizing an interlevel insulating layer in an integrated circuit device, the method comprising:

forming an interlevel insulating layer having a high step difference region on a cell block and a low step difference region on a neighboring region over an entire surface of an integrated circuit substrate, in which a plurality of chip areas are formed, each chip area including cell blocks on which a plurality of unit cells are formed and the neighboring region;

forming a mask pattern having a cell open region, which exposes the high step difference region and has different separation distances from an edge of the cell block, on the interlevel insulating layer;

performing a partial etch on the high step difference region using the mask pattern as an etch mask to decrease a step difference between the high step difference region and the low step difference region;

removing the mask pattern used as the etch mask; and performing chemical mechanical polishing (CMP) on the interlevel insulating layer on the high step difference region subjected to the partial etch and the low step difference region to planarize the interlevel insulating layer.

18. A method according to claim 17, wherein the cell open region adjacent to a wide step difference region has a long separation distance from an edge of the cell block, compared with the cell open region adjacent to a narrow low step difference region.

19. A method according to claim 18, wherein the wide low step difference region is a test element group (TEG) region, a peripheral circuit region, or a scribe line region, while the narrow low step difference region is a core region.

20. A method according to claim 18, wherein the cell block of the cell open region adjacent to the wide low step difference region has a separation distance from an edge of the cell block of 20% to 50% of the width of the cell block, and the cell open region adjacent to the narrow low step difference region has a separation distance from an edge of the cell block of 2–5 $\mu$m.

21. A method according to claim 20, wherein the cell open region adjacent to the wide low step difference region has a separation distance from the edge of the cell block of 20–80 $\mu$m.

22. A method according to claim 17, wherein the interlevel insulating layer is formed of a borophosphosilicate glass (BPSG) layer, a phosphosilicate glass (PSG) layer, a plasma enhanced tetraethylorthosilicate (PE-TEOS) layer, an undoped silicate glass (PSG) layer, or a flowable oxide (FOX) layer.

23. A method according to claim 17, wherein the partial etch of the interlevel insulating layer is performed using dry etching or wet etching.

24. A method of planarizing an interlevel insulating layer in an integrated circuit device, the method comprising the steps of:

forming an interlevel insulating layer having a high step difference region on a cell block and a low step difference region on a neighboring region due to a height of a capacitor over an integrated circuit substrate including the cell block on which a capacitor is formed and the other neighboring regions;

forming a mask pattern having a cell open region, which exposes the high step difference region and has different separation distances from an edge of the cell block, on the interlevel insulating layer;

performing a partial etch on the high step difference region using the mask pattern as an etch mask to decrease a step difference between the high step difference region and the low step difference region;

removing the mask pattern used as the etch mask; and performing chemical mechanical polishing (CMP) on the interlevel insulating layer on the high step difference region subjected to the partial etch and the low step difference region to planarize the interlevel insulating layer.

25. A method according to claim 24, wherein the cell open region adjacent to a wide low step difference region has a long separation distance from an edge of the cell block, compared with the cell open region adjacent to a narrow low step difference region.

26. A method according to claim 25, wherein the wide low step difference region is a test element group (TEG) region, a peripheral circuit region, or a scribe line region, while the narrow low step difference region is a core region.

27. A method according to claim 24, wherein the interlevel insulating layer is formed of a borophosphosilicate glass (BPSG) layer, a phosphosilicate glass (PSG) layer, a plasma enhanced tetraethylorthosilicate (PE-TEOS) layer, an undoped silicate glass (PSG) layer, or a flowable oxide (FOX) layer.

28. A method according to claim 24, wherein the partial etch of the interlevel insulating layer is performed using dry etching or wet etching.

29. A method according to claim 24, wherein a portion of the interlevel insulating layer is left on an upper electrode of the capacitor during the CMP of the interlevel insulating layer.

* * * * *